(12) United States Patent
Zeng et al.

(10) Patent No.: US 12,550,452 B2
(45) Date of Patent: Feb. 10, 2026

(54) SILICON CONTROLLED RECTIFIERS

(71) Applicant: GlobalFoundries Singapore Pte. Ltd., Singapore (SG)

(72) Inventors: Jie Zeng, Singapore (SG); Sagar P. Karalkar, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 402 days.

(21) Appl. No.: 18/126,006

(22) Filed: Mar. 24, 2023

(65) Prior Publication Data
US 2024/0321864 A1 Sep. 26, 2024

(51) Int. Cl.
H10D 89/60 (2025.01)

(52) U.S. Cl.
CPC .................. H10D 89/713 (2025.01)

(58) Field of Classification Search
CPC ...... H10D 8/80; H10D 62/125; H10D 89/713; H10D 18/00–80; H10D 62/142; H10D 62/148
See application file for complete search history.

(56) References Cited

U.S. PATENT DOCUMENTS

| | | | |
|---|---|---|---|
| 6,768,619 B2 | 7/2004 | Ker et al. | |
| 6,909,149 B2 | 6/2005 | Russ et al. | |
| 6,964,883 B2 | 11/2005 | Chang | |
| 8,384,125 B2 | 2/2013 | Gauthier, Jr. et al. | |
| 9,287,255 B2 | 3/2016 | Zhan et al. | |
| 10,361,185 B2 | 7/2019 | Zhan et al. | |
| 2005/0212051 A1 | 9/2005 | Jozwiak et al. | |
| 2009/0206367 A1* | 8/2009 | Gauthier, Jr. | H10D 89/711 |
| | | | 257/E21.388 |
| 2012/0098031 A1* | 4/2012 | Wang | H10D 8/80 |
| | | | 257/168 |
| 2014/0346563 A1 | 11/2014 | Salcedo et al. | |
| 2021/0104512 A1* | 4/2021 | Mitra | H10D 62/126 |
| 2021/0335997 A1* | 10/2021 | Zhu | H10D 18/251 |

FOREIGN PATENT DOCUMENTS

| | | |
|---|---|---|
| CN | 102956632 A | 3/2013 |
| CN | 110047828 A | 7/2019 |
| CN | 114068525 A | 2/2022 |

OTHER PUBLICATIONS

Extended European Search Report for European Application No. 24152744.9, mailed Jul. 5, 2024, 8 pages.
Zhan et al., "High-Performance Bi-directional SCR Developed on a 0.13um SOI-based Smart Power Technology for Automotive Applications", IEEE, 2017 39th Electrical Overstress/Electrostatic Discharge Symposium (EOS/ESD), 7 pages.

* cited by examiner

Primary Examiner — Wasiul Haider
(74) Attorney, Agent, or Firm — Francois Pagette; Andrew M. Calderon; Calderon Safran & Wright P.C.

(57) ABSTRACT

The present disclosure relates to semiconductor structures and, more particularly, to silicon control rectifiers and methods of manufacture. The structure includes: a first well in a semiconductor substrate; a second well in the semiconductor substrate; a third well in the semiconductor substrate which isolates the first well from the second well; and a first diffusion region at a surface of the semiconductor substrate and which extends into the first well and the second well, the first diffusion region includes a same polarity as the third well.

17 Claims, 4 Drawing Sheets

SILICON CONTROLLED RECTIFIERS

BACKGROUND

The present disclosure relates to semiconductor structures and, more particularly, to silicon control rectifiers and methods of manufacture.

A silicon controlled rectifier (SCR) is a solid-state current-controlling device, which is a unidirectional device (i.e., can conduct current only in one direction). The SCR typically includes a switching configuration comprising p-n-p-n layers.

A holding current of an SCR can be defined as the smallest amount of current under which an anode current has to drop to enter an OFF status. This means if the holding current value is 5 mA, for example, subsequently the SCR's anodes' current has to turn into less than 5 mA to discontinue performing. A triggering voltage, on the other hand, may occur when the anode terminal is made +ve relating to the cathode in which case the SCR will be in a forwarding biased mode, e.g., enters into the forward blocking state. This means the device is switched from the blocked (OFF) state to the unblocked (ON) state.

SUMMARY

In an aspect of the disclosure, a structure comprises: a first well in a semiconductor substrate; a second well in the semiconductor substrate; a third well in the semiconductor substrate which isolates the first well from the second well; and a first diffusion region at a surface of the semiconductor substrate, and which extends into the first well and the second well, the first diffusion region comprises a same polarity as the third well.

In an aspect of the disclosure, a structure comprises: a first well in a semiconductor substrate and electrically coupled to an anode; a second well in the semiconductor substrate and electrically coupled to a cathode; a third well in the semiconductor substrate which isolates the first well from the second well; and a diffusion region extending over the third well and into the first well and the second well.

In an aspect of the disclosure, a method comprises: forming a first well in a semiconductor substrate; forming a second well in the semiconductor substrate; forming a third well in the semiconductor substrate which isolates the first well from the second well; and forming a first diffusion region at a surface of the semiconductor substrate and which extends into the first well and the second well, the first diffusion region comprises a same polarity as the third well.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to silicon control rectifiers and methods of manufacture. More specifically, the silicon control rectifiers (SCR) may be bi-directional SCRs with improved failure current. In embodiments, the SCR may be implemented in semiconductor on insulator (SOI) technology. Advantageously, the SCRs described in the present disclosure provide high failure current for area-efficient electrostatic discharge (ESD) protection capability on SOI technologies.

In more specific embodiments, a symmetrical SCR device includes a base region comprising a deep portion, an intermediate depth portion, and a shallow depth portion between the deep portion and the intermediate depth portion. The shallow depth portion comprises an N+ diffusion region comprising a higher doping concentration than the intermediate depth portion, i.e., N− diffusion regions, and the intermediate depth portion comprises a higher doping concentration than the deep portion (e.g., N-well) which isolates P-wells. A buried insulator material, e.g., buried oxide, may be underneath the base region, with the deep portion extending to the buried insulator material. The intermediate depth portion does not directly contact the deep portion. And, the shallow depth portion may be longer than the deep portion, with the intermediate depth portion surrounding both the deep portion and the shallow depth portion.

The SCRs of the present disclosure can be manufactured in a number of ways using a number of different tools. In general, though, the methodologies and tools are used to form structures with dimensions in the micrometer and nanometer scale. The methodologies, i.e., technologies, employed to manufacture the SCRs of the present disclosure have been adopted from integrated circuit (IC) technology. For example, the structures are built on wafers and are realized in films of material patterned by photolithographic processes on the top of a wafer. In particular, the fabrication of the SCRs uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
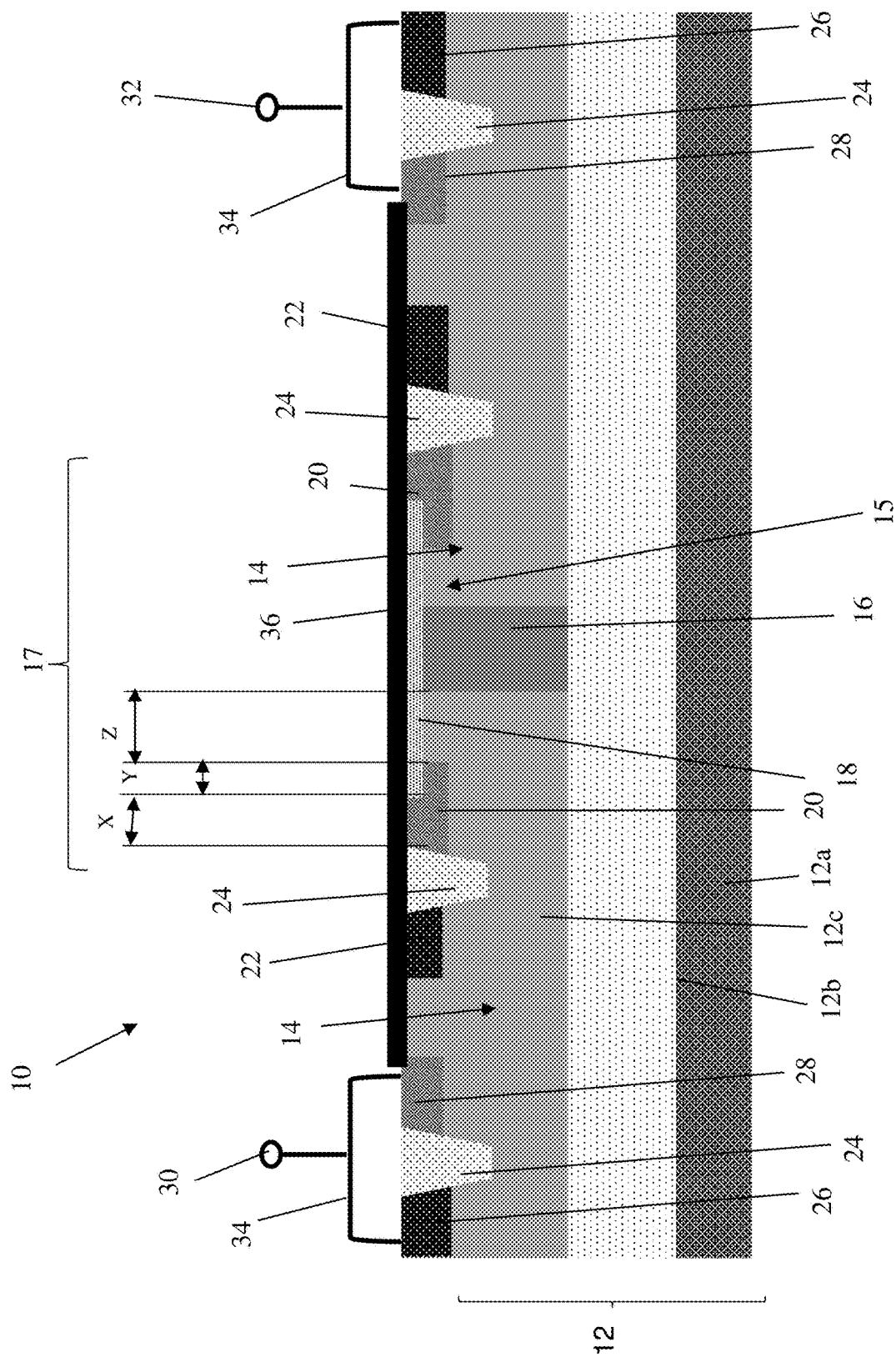
FIG. 1 shows a silicon controlled rectifier (SCR) device and respective fabrication processes in accordance with aspects of the present disclosure.

FIG. 1 shows an SCR device and respective fabrication processes in accordance with aspects of the present disclosure. The structure 10 of FIG. 1 may be a bi-directional SCR device comprising a symmetrical structure in SOI technology. In embodiments, the SOI technology includes a substrate 12 comprising, from bottom to top, a handle wafer (e.g., semiconductor substrate) 12a, a buried insulator layer 12b and a top semiconductor layer 12c. In embodiments, the top semiconductor layer 12c may include two P-wells 14 separated by a single N-well 16 extending to the buried insulator layer 12b as described in more detail herein.

The handle wafer 12a may include a semiconductor material such as, for example, Si, Ge, SiGe, SiC, SiGeC, III-V compound semiconductor, II-VI compound semiconductor or any combinations thereof. The handle wafer 12a provides mechanical support to the buried insulator layer 12b and the top semiconductor layer 12c. The buried insulator layer 12b may include a dielectric material, e.g., SiN, $SiO_2$ $Si_2N_2O$, boron nitride or a combination thereof. In one preferred embodiment, the buried insulator layer 12b comprises a buried oxide (BOX). The buried insulator layer 12b may be formed by a deposition process, e.g., chemical vapor deposition (CVD), plasma enhanced CVD (PECVD) or physical vapor deposition (PVD). In further embodiments, the buried insulator layer 12b may be formed using a thermal growth process, separation by implantation of oxygen (SIMOX) process, oxidation process or an oxygen implant process.

The top semiconductor layer 12c may include any semiconductor material as mentioned above for the handle wafer 12a. In preferred embodiments, the top semiconductor layer 12c comprises a single crystallographic orientation, e.g., a (100), (110), (111), or (001) crystallographic orientation. The top semiconductor layer 12c may be formed by a deposition process, e.g., CVD or PECVD or an epitaxial growth process as is known in the art such that no further explanation is required for a complete understanding of the present disclosure.

In embodiments, the top semiconductor layer 12c may include P-wells 14 separated (e.g., isolated) from one another by an N-well 16 (e.g., deep portion). The N-well 16 extends to and contacts the buried insulator layer 12b in order to isolate the P-wells 14. In more specific embodiments, the N-well 16 extends from an N+ diffusion region 18 (e.g., shallow depth portion) at a top surface of the top semiconductor layer 12c to the buried insulator layer 12b. In embodiments, the N+ diffusion region 18 physically and electrically connects to N− diffusion regions 20 (e.g., intermediate depth portion) on both sides of the N+ diffusion region 18. That is, the N+ diffusion region 18 is surrounded by the N− diffusion regions 20 and, in embodiments, the N+ diffusion region 18 overlaps with the N− diffusion regions 20 by a space "Y". The N− diffusion regions 20 do not contact the N-well 16, being separated by the N+ diffusion region 18. The space "X" and the space "Z" may be adjusted to provide improved thermal dissipation in order to achieve higher failure current.

FIG. 1 further shows the N− diffusion regions 20 and N+ diffusion region 18 symmetrically positioned about the N-well 16, each of which are within the P-wells 14. In embodiments, the N+ diffusion region 18 comprises a higher concentration of dopant, e.g., Arsenic (As), Phosphorus (P) and (Antimony) Sb, than the N− diffusion regions 20 and the N-well 16. Also, the N− diffusion regions 20 comprises a higher concentration of dopant, e.g., Arsenic (As), Phosphorus (P) and (Antimony) Sb, than the N-well 16.

In further embodiments, the N− diffusion regions 20 may be deeper into the top semiconductor layer 12c than the N+ diffusion region 18, with the N+ diffusion region 18 being longer than the N-well 16 such that is extends symmetrically into both of the P-wells 14. It should be understood, though, that other dimensions are contemplated by the present disclosure. In addition, the N+ diffusion region 18 and the N− diffusion regions 20 may be separated from and do not contact the underlying buried insulator layer 12b. In this way, a junction breakdown region 15 may be formed at the diffusion regions 18, 20 and P-well 14, which is shifted away from the dielectric boundary of the underlying buried insulator layer 12b. The diffusion regions 18, 20 and N+ well 16 may be defined as a base region 17 of the structure 10.

In further embodiments, P+ diffusion regions 22 may optionally be provided within the P-wells 14. The P+ diffusion regions 22 may be used to increase the holding voltage of the SCR. In embodiments, the P+ diffusion regions 22 may be separated from the N− diffusion regions 20 by shallow trench isolation structures 24.

Still referring to FIG. 1, diffusion regions 26, 28 may be formed in the P-wells 14 and may be connected to respective terminals 30, 32. In embodiments, the diffusion regions 26 may be P+ diffusion regions and the diffusion regions 28 may be N+ diffusion regions. The diffusion regions 26, 28 may be isolated from one another by shallow trench isolation structures 24. The terminal 30 may be an anode and the terminal 32 may be a cathode, each of which connect to the respective diffusion regions 26, 28 using wiring structures 34. In embodiments, the wiring structures 34 may be middle of the line wiring structures, e.g., interconnects and wiring, as is known in the art such that no further explanation is required for a complete understanding of the present disclosure.

In embodiments, the wiring structures 34 may be formed to silicide contacts on the P+ diffusion regions 26 and the N+ diffusion regions 28. A silicide blocking material 36 may be used to prevent silicide from forming on the diffusion regions 18, 20, 22. In embodiments, the silicide blocking material 36 may be a nitride material; although other blocking materials are also contemplated herein.

As should be understood by those of skill in the art, the silicide contacts may be formed by deposition of a thin transition metal layer, e.g., nickel, cobalt or titanium, over fully formed and patterned semiconductor material (e.g., diffusion regions). After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts in the active regions of the device.

The wiring structures 34 may be formed by conventional lithography, etching and deposition processes. For example, an interlevel dielectric material may be formed over the semiconductor substrate 12, e.g., over the diffusion regions 26, 28 and shallow trench isolation structures 24. The interlevel dielectric material may comprise a combination of nitride and/or oxide based materials, e.g., SiN and $SiO_2$, deposited using conventional deposition processes, e.g., chemical vapor deposition (CVD). Vias or trenches may be formed within the interlevel dielectric material to expose the P+ diffusion regions 26 and N+ diffusion regions 28. After silicide formation, the wiring structures 34 may be formed within the vias or trenches of the interlevel dielectric material, landing on the silicide contacts on the P+ diffusion regions 26 and N+ diffusion regions 28. The wiring structures 34 may include interconnects comprising tungsten, for example, lined with TaN or TiN and deposited using a conventional deposition process, e.g., CVD, followed by a chemical mechanical polishing (CMP) process to remove any excessive material on the surface of the interlevel dielectric material.

The P-wells 14, N-well 16 and diffusion regions 18, 20, 22, 26, 28 may be formed by an ion implantation process which introduces a concentration of different dopant types (e.g., conductivity) and concentrations into the top semiconductor layer 12c. In embodiments, respective patterned implantation masks may be used to define selected areas exposed for the implantations, each of which may be stripped after implantation, and before the deposition of another implantation mask used to form other wells and/or diffusion regions. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-well 14 and P+ diffusion regions 22, 26 may be doped with p-type dopants, e.g., Boron (B); whereas the N-well 16 and N diffusion regions 18, 20, 28 may be doped with n-type dopants, e.g., Arsenic (As), Phosphorus (P) and (antimony) Sb, among other suitable examples, at different concentrations as described herein.

It should be recognized by those of skill in the art that the P-wells 14, N-well 16 and diffusion regions 18, 20, 22 may have opposite doping polarities. For example, the P-wells 14 may be N-wells and the N-well 16 may be a P-well, with the diffusion regions 18, 20 being p-type diffusion regions and diffusion region 22 being an n-type diffusion region. In this way, the structure 10 may be an NPN device.

Figure 2:
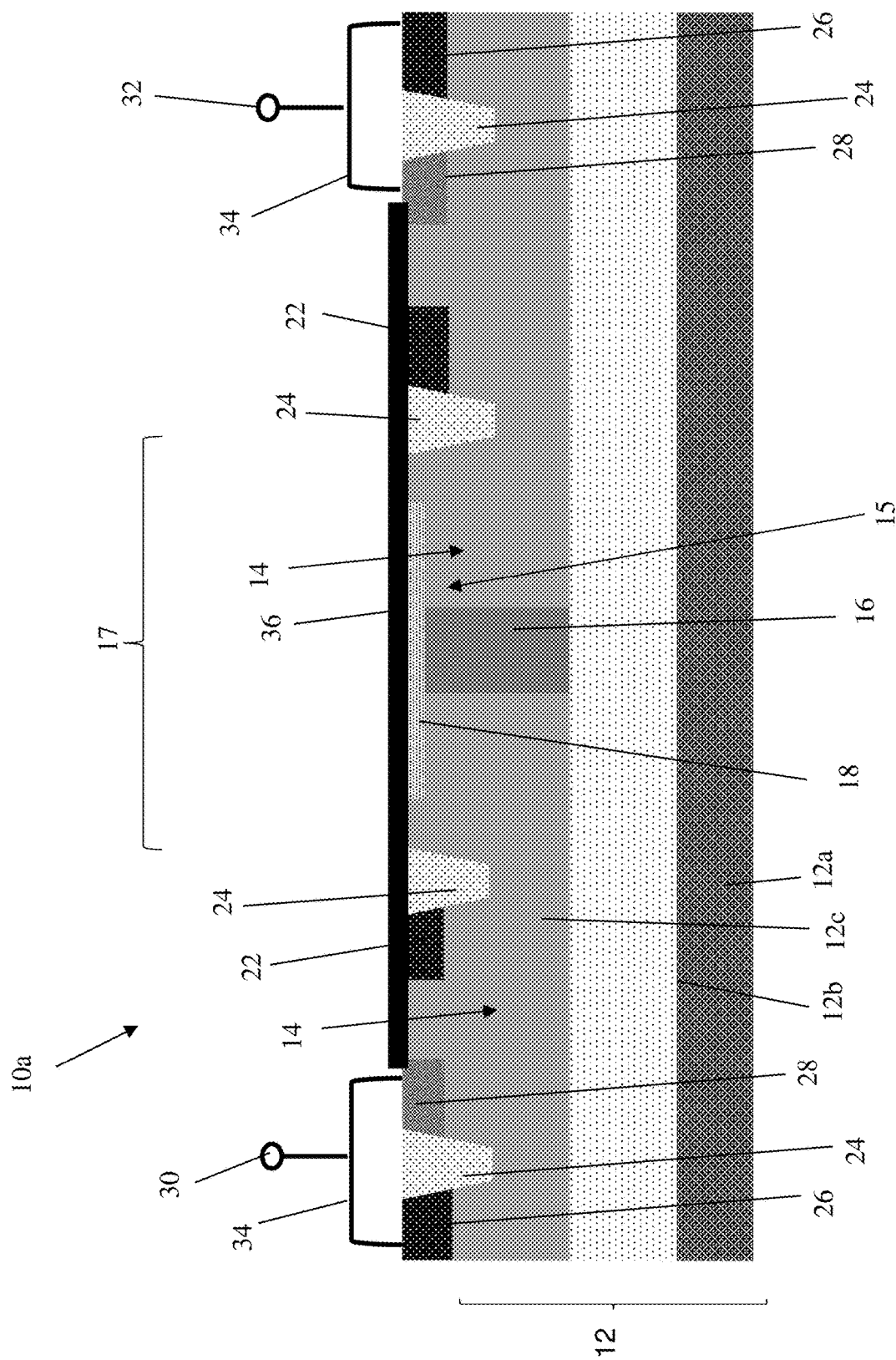
FIG. 2 shows an SCR device in accordance with additional aspects of the present disclosure.

FIG. 2 shows an SCR device in accordance with additional aspects of the present disclosure. In the structure 10*a* of FIG. 2, the N– diffusion regions within the P-wells 14 may be removed. In this way, the N+ diffusion region 18 no longer makes contact to any diffusion regions within the P-wells 14. The remaining features of the structure 10*a* are similar to the structure 10 of FIG. 1 such that no further description is required for a complete understanding of the present disclosure.

Figure 3:
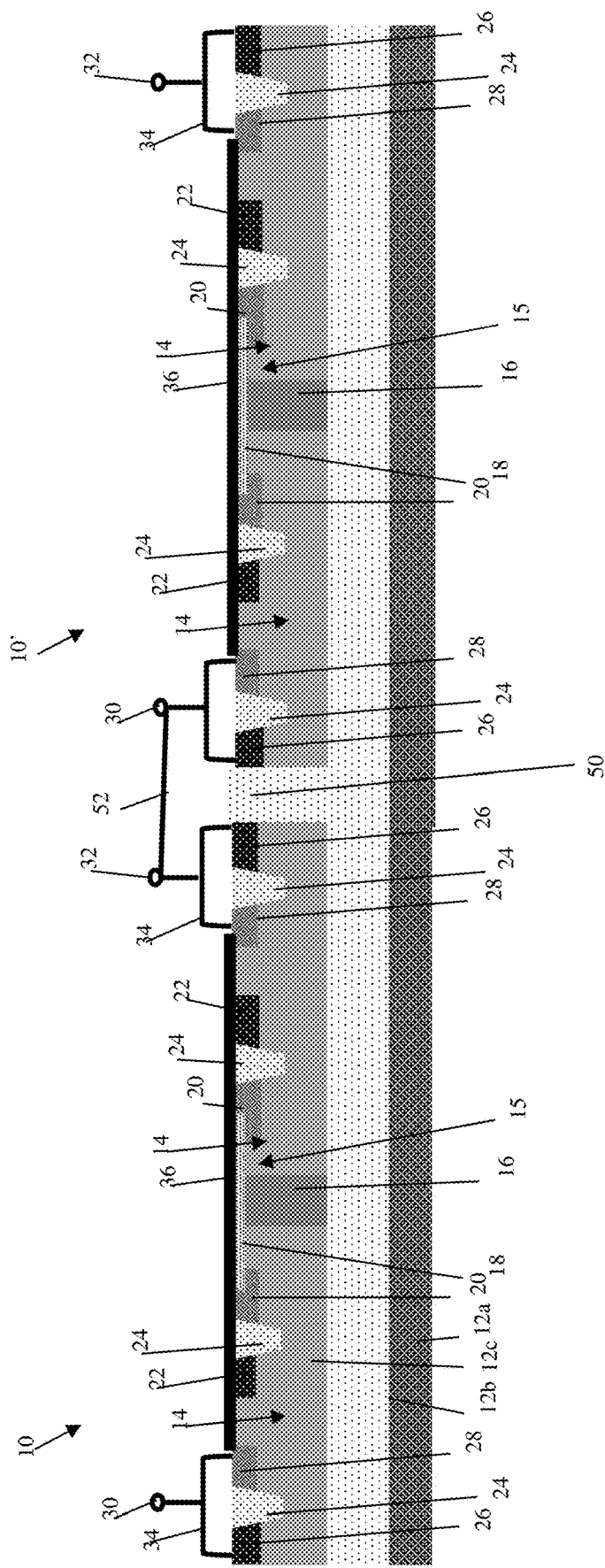
FIG. 3 shows a string (stack) of SCR devices in accordance with additional aspects of the present disclosure.

FIG. 3 shows a string (stack) of SCR devices in accordance with aspects of the present disclosure. In particular, FIG. 3 shows structures 10, 10' similar to that disclosed with respect to FIG. 1 electrically connected together by wiring structure 52. More particularly, the wiring structure 52 electrically connects a cathode 32 of the first structure 10 to an anode 30 of the second structure 10'. The adjacent diffusion regions 26 and P-wells 16 of each of the structures 10, 10' may be separated, i.e., isolated, from one another by a deep trench isolation structure 50. It should be understood by those of skill in the art that two or more SCR devices can be strung together similar to the manner shown in FIG. 3.

Figure 4:
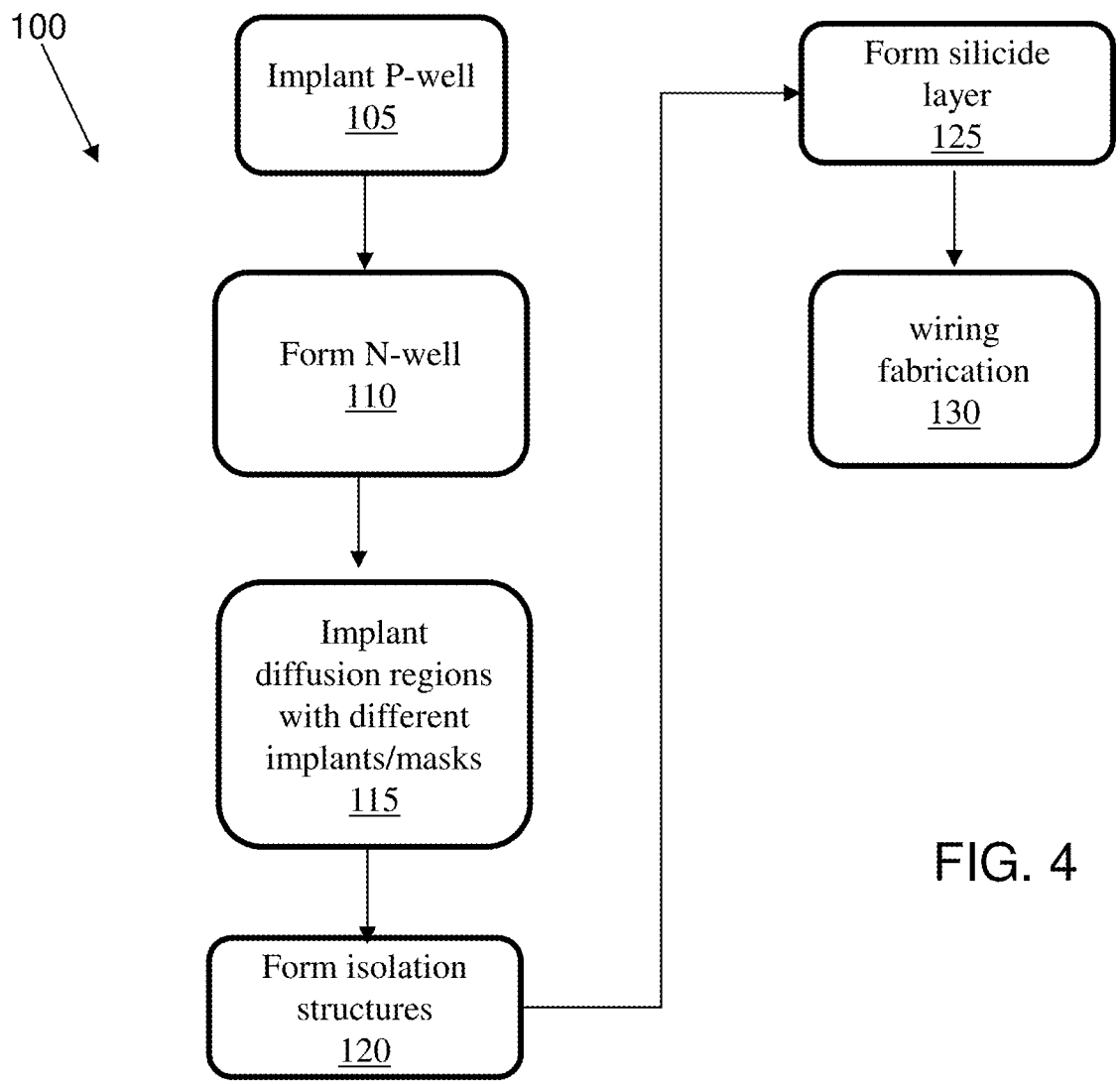
FIG. 4 shows a process flow representative of fabrication processes for manufacturing the SCR devices of FIGS. 1-3.

FIG. 4 shows a process flow representative of fabrication processes for manufacturing the bi-directional SCRs of FIGS. 1-3. At step 105, the P-wells 14 may be formed in the top semiconductor layer 12*c*. In embodiments, a single P-well 14 may be formed by an ion implantation process as already noted with respect to FIG. 1.

At step 110, the N-well 16 may be formed in the top semiconductor layer 12*c* within the P-well 14. In embodiments, the N-well 16 may extend to the underlying buried insulator layer 12*c*, separating the P-well into two isolated P-wells 14. The N-well 16 may be formed by an ion implantation process as already noted with respect to FIG. 1.

At step 115, diffusion regions 18, 20, 22, 26, 28 may be formed using separate ion implantation processes with different masks as described herein. In these processes, respective patterned implantation masks may be used to define selected areas exposed for the implantations. The implantation mask used to select the exposed area for forming a single feature is stripped after implantation, and before the implantation mask used to form another feature as is known in the art. Also, depending ion the concentrations and depths of the diffusion regions 18, 20, 22, 26, 28 higher or lower dopant concentrations and energy can be implemented as should be understood by those of skill in the art.

At step 120, the isolation structures 24 may be formed in the top semiconductor layer 12*c*. The isolation structures 24 may be formed before or after formation of the diffusion regions. In any scenario, the isolation structures 24 will isolate the different diffusion regions 20, 22, 26, 28 as already described herein.

The isolation structures 24 can be formed by conventional lithography, etching and deposition methods known to those of skill in the art. For example, a resist formed over the top semiconductor layer 12*c* may be exposed to energy (light) and developed utilizing a conventional resist developer to form a pattern (opening). An etching process with a selective chemistry, e.g., reactive ion etching (RIE), will be used to transfer the pattern from the patterned photoresist layer to the top semiconductor layer 12*c* to form one or more trenches in the top semiconductor layer 12*c* through the openings of the resist. Following the resist removal by a conventional oxygen ashing process or other known stripants, insulator material, e.g., $SiO_2$, can be deposited by any conventional deposition processes, e.g., chemical vapor deposition (CVD) processes. Any residual material on the surface of the top semiconductor layer 12*c* can be removed by conventional CMP processes.

At step 125, the silicide contacts may be formed to the diffusion regions 24, 26. The silicide contacts may be formed by a silicide process as described with respect to FIG. 1.

At step 130, the wiring structures 34 to the anode 30 and the cathode 32 may be formed using conventional lithography, etching and deposition processes. For example, the contacts may be fabricated by forming a via in an interlevel dielectric material, following by deposition of metal material, e.g., tungsten, aluminum, copper, etc., and followed by a chemical mechanical polishing (CMP) process. The wiring structures may be formed in a manner similar to CMOS wiring layers, e.g., conventional lithography, etching and deposition processes as is known in the art such that no further explanation is required herein for a complete understanding of the present disclosure.

The SCRs can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first well in a semiconductor substrate;
   a second well in the semiconductor substrate;
   a third well in the semiconductor substrate which isolates the first well from the second well;
   a first diffusion region at a surface of the semiconductor substrate and which extends into the first well and the second well, the first diffusion region comprises a same polarity as the third well; and
   a silicide blocking material over the first diffusion region and the third well.

2. The structure of claim 1, wherein the first diffusion region is longer than the third well such that the first diffusion region extends into the first well and the second well.

3. The structure of claim 2, wherein the first well and the second well comprise P-wells and the third well comprises an N-well.

4. The structure of claim 3, wherein the semiconductor substrate comprises semiconductor on insulator material, and the third well contacts to a buried insulator layer under the semiconductor on insulator material to isolate the first well from the second well.

5. A structure comprising:
   a first well in a semiconductor substrate;
   a second well in the semiconductor substrate;
   a third well in the semiconductor substrate which isolates the first well from the second well; and
   a first diffusion region at a surface of the semiconductor substrate and which extends into the first well and the second well, the first diffusion region comprises a same polarity as the third well,
   wherein the first well and the second well comprise P-wells and the third well comprises an N-well,
   the first diffusion region is longer than the third well such that the first diffusion region extends into the first well and the second well, and
   the first well is deeper into the semiconductor substrate than the first diffusion region and has a lower concentration of dopant than the first diffusion region.

6. The structure of claim 3, further comprising a second diffusion region comprising a same polarity as the first diffusion region, the second diffusion region contacting the first diffusion region and being separated from the third well by the first diffusion region.

7. The structure of claim 6, wherein, relative to one another, the third well comprises a deepest depth in the semiconductor substrate, the second diffusion region comprises an intermediate depth in the semiconductor substrate and the first diffusion region comprises a shallowest depth in the semiconductor substrate.

8. The structure of claim 6, wherein, relative to one another, the third well comprises a lowest concentration of dopant, the second diffusion region comprises an intermediate concentration of the dopant and the first diffusion region comprises a highest concentration of the dopant.

9. The structure of claim 6, wherein the third well is surrounded by the first diffusion region comprising an N+ diffusion region and the first diffusion region is surrounded by the second diffusion region comprising an N− diffusion region.

10. The structure of claim 6, further comprising a silicide blocking material over the first diffusion region, the second diffusion region and the third well.

11. The structure of claim 1, further comprising diffusion regions separated by plurality of shallow trench isolation structures and provided in the first well and the second well, the diffusion regions connecting to an anode and a cathode.

12. A structure comprising:
    a first well in a semiconductor substrate and electrically coupled to an anode;
    a second well in the semiconductor substrate and electrically coupled to a cathode;
    a third well in the semiconductor substrate which isolates the first well from the second well; and
    a diffusion region extending over the third well and into the first well and the second well,
    wherein the third well and the diffusion region comprise a first polarity type with different dopant concentrations, and the first well and the second well comprise a second polarity type different from the first polarity type.

13. The structure of claim 12, wherein the first polarity type is an N-type dopant and the second polarity type is a P-type dopant.

14. The structure of claim 12, wherein the third well is deeper in the semiconductor substrate than the diffusion region.

15. The structure of claim 12, further comprising a second diffusion region in the first well and the second well, the second diffusion region surrounding and in contact with the diffusion region, being remote from the first well, and which comprises the N-type dopant.

16. The structure of claim 15, wherein the second diffusion region has a dopant concentration greater than the third well and the diffusion region has a dopant concentration greater than both the second diffusion region and the third well.

17. A method comprising:
    forming a first well in a semiconductor substrate;
    forming a second well in the semiconductor substrate;
    forming a third well in the semiconductor substrate which isolates the first well from the second well; and
    forming a first diffusion region at a surface of the semiconductor substrate and which extends into the first well and the second well, the first diffusion region comprises a same polarity as the third well,
    wherein the third well and the diffusion region comprise a first polarity type with different dopant concentrations, and the first well and the second well comprise a second polarity type different from the first polarity type.

* * * * *